United States Patent [19]

Cook et al.

[11] 4,096,436
[45] Jun. 20, 1978

[54] POWER MONITOR

[75] Inventors: Kenneth J. Cook, Oak Park; Robert C. Murray, Troy, both of Mich.

[73] Assignee: The Valeron Corporation, Oak Park, Mich.

[21] Appl. No.: 799,375

[22] Filed: May 23, 1977

[51] Int. Cl.² .............................................. G01R 21/00
[52] U.S. Cl. .................................................... 324/142
[58] Field of Search ........................ 324/142, 133, 127

[56] References Cited

U.S. PATENT DOCUMENTS

| 3,934,198 | 1/1976 | Milkovic | 324/142 |
| 3,953,795 | 4/1976 | Brunner et al. | 324/142 |
| 3,955,138 | 5/1976 | Milkovic | 324/142 X |

FOREIGN PATENT DOCUMENTS

| 472,677 | 6/1969 | Switzerland | 324/142 |

*Primary Examiner*—Stanley T. Krawczewicz
*Attorney, Agent, or Firm*—Krass & Young

[57] ABSTRACT

A power monitor including a high power shunt connected in series with an electrical load to develop a signal proportional to current which is then modulated. A second signal proportional to the voltage across the load is developed by a voltage divider network. The two signals are applied as inputs to an electronic multiplier which produces a modulated output signal which is proportional to the power being dissipated by the load. The ouput signal from the multiplier is fed through an isolation transformer which passes the modulated power signal, but blocks the high load voltage. The power signal is then demodulated, filtered and displayed digitally on a meter. This signal is also provided as an analog output. An oscillator synchronizes both the demodulator and modulator, the oscillator drive of the modulator being isolated. When the load is a three-phase device, two such watt-meter modules are employed to measure the current and voltages associated with two of the three legs of the load, the output of the demodulators of the two modules are then summed, passed through a filter and displayed as a single power reading. During the summation process, the demodulated output signal is electrically scaled to read as horsepower, kilowatts, or percent of full scale.

21 Claims, 6 Drawing Figures

POWER MONITOR

INTRODUCTION

This invention relates to methods and apparatus for measuring electrical power and specifically to a power monitor in which the indicator portion of the monitor is electrically isolated from the high line voltage and current being measured.

BACKGROUND OF THE INVENTION

Wattage is a measure of work which may be alternately expressed in horsepower. Since Wattage is an electrical quantity, it can be electronically calculated and converted into units of horsepower. To calculate wattage drawn by an electrical device, a wattmeter may multiply the current flowing through the device by the voltage drop across the device. The multiplication must be calculated at every instant in time when alternating voltages and currents are present. Converting the wattage drawn by an electrical device to a value of horsepower is a simple mathematical multiplication accomplished by scaling or amplifying.

Horsepower and wattmeters are commonly used to determine the power dissipated in electrical loads, such as large electrical motors, lathes, machine tools and the like. Monitoring the power requirements of such devices is useful for speed control, recording operational parameters, maximizing operational efficiencies, preventive maintenance and the like. Historically, wattmeters have been galvanometer types which make use of the magnetic interaction between a moving electromagnet on the pointer of the meter and stationary electromagnets. The multiplication of current and voltage necessary to determine power is accomplished by mechanically passing these two coils through one another's electromagnetic fields. This type of meter has a number of serious drawbacks. First, perfect coupling cannot be achieved between the electromagnetic fields and, thus, inaccuracies are introduced into the meter. Secondly, this type of meter does not lend itself well to interfacing with electronic equipment, such as process controllers or recorders, due to the heavy current which is necessarily passed through the meter.

A second and more modern type of wattmeter uses the Hall effect principal in an integrated circuit surrounded by the same type of electromagnets as in the galvanometer wattmeter. This type of wattmeter can be interfaced with electronic equipment, but shares another drawback with the galvanometer. Any wattmeter must sense current flow into the device whose wattage is being measured, and in the case of the Hall effect meter or the galvanometer, this current must flow through heavy windings (electromagnets) within the instrument. When the current flow is too great for the meter's internal windings to carry, an external current transformer must be used which introduces greater cost, greater instrument error and restricts use to AC applications only. Additionally, wattmeters are dangerous to use, in that extremely high voltages and currents are flowing through exposed terminals on the instrument and handling of the instrument during operation, such as for changing meter scaling and the like, can be extremely hazardous. Still another shortcoming is the physical size of wattmeters. The size is necessitated by the large current coils contained within the instrument's housing, as well as the physical bulk of the meter movement itself. Finally, some wattmeters are not universally adaptable for AC and DC operation without adjustment and/or modification.

BRIEF DESCRIPTION OF THE INVENTION

The present invention overcomes the abovedescribed shortcomings of Hall effect and galvanometer type wattmeters by providing a monitor which senses load current and voltage by means other than large windings within the instrument itself. The monitor also electrically isolates the "read-out" portion of the meter from the extremely high voltages found in many applications. This not only promotes safety for the user, but also allows monitoring of the power used by an electrical load at a location which is remote from the actual load, such as a central control panel. A high power shunt is wired in series with the load. In operation, the voltage drop across the shunt is proportional to the current flowing through the load. The monitor senses the voltage across the load with a voltage divider network whose output signal is electronically multiplied with the current signal from the shunt. This electronic multiplication avoids any form of mechanical interaction of coils and their inherent inaccuracies. Isolation of the output signal is achieved by an isolating device which magnetically couples the output circuit with the high voltage side of the monitor while electrically isolating the two. After passing through the isolation stage, the output signal is filtered and displayed in usable form.

Another advantage of the present invention arises from the inherent compactness and relative low cost of integrated circuits, as compared to large, inductive, galvanometer type devices and their related current coils. This allows an extremely compact wattmeter module which can be literally inserted in-line with the electrical load.

Still another advantage of the present invention is the extremely fast response time of the multiplier. Conventional movement coil-type units require a relatively substantial amount of time to align themselves and stabilize. Comparatively, the electronic calculation of the current-voltage product is substantially instantaneous. This fast response time would be particularly important when applied to feedback control systems.

In the preferred embodiment of the invention, still another advantage is in the universal adaptability of the device to DC, AC single phase and AC multiple phase application. This is accomplished through synchronous modulator and demodulator circuits in the wattmeter module. In addition to rendering the power monitor universal, the synchronous modulation and demodulation permits the multiplier and isolation stages to achieve optimum efficiency and reduced physical size.

An alternative embodiment of the power monitor which would be employed for three-phase work incorporates two of the above-described wattmeter modules, electrically interconnected to the load to independently read the line current and voltage through two of the three legs of the load. The outputs of the two wattmeter modules are summed and fed to a filter and display, as described before.

Various other features and advantages of this invention will become apparent upon reading the following specification, which, along with the patent drawings, describes and discloses a preferred illustrative embodiment of the invention in great detail.

The invention makes reference to the accompanying drawings.

DETAILED DESCRIPTION OF THE SPECIFIC EMBODIMENT

Figures 1, 1A:
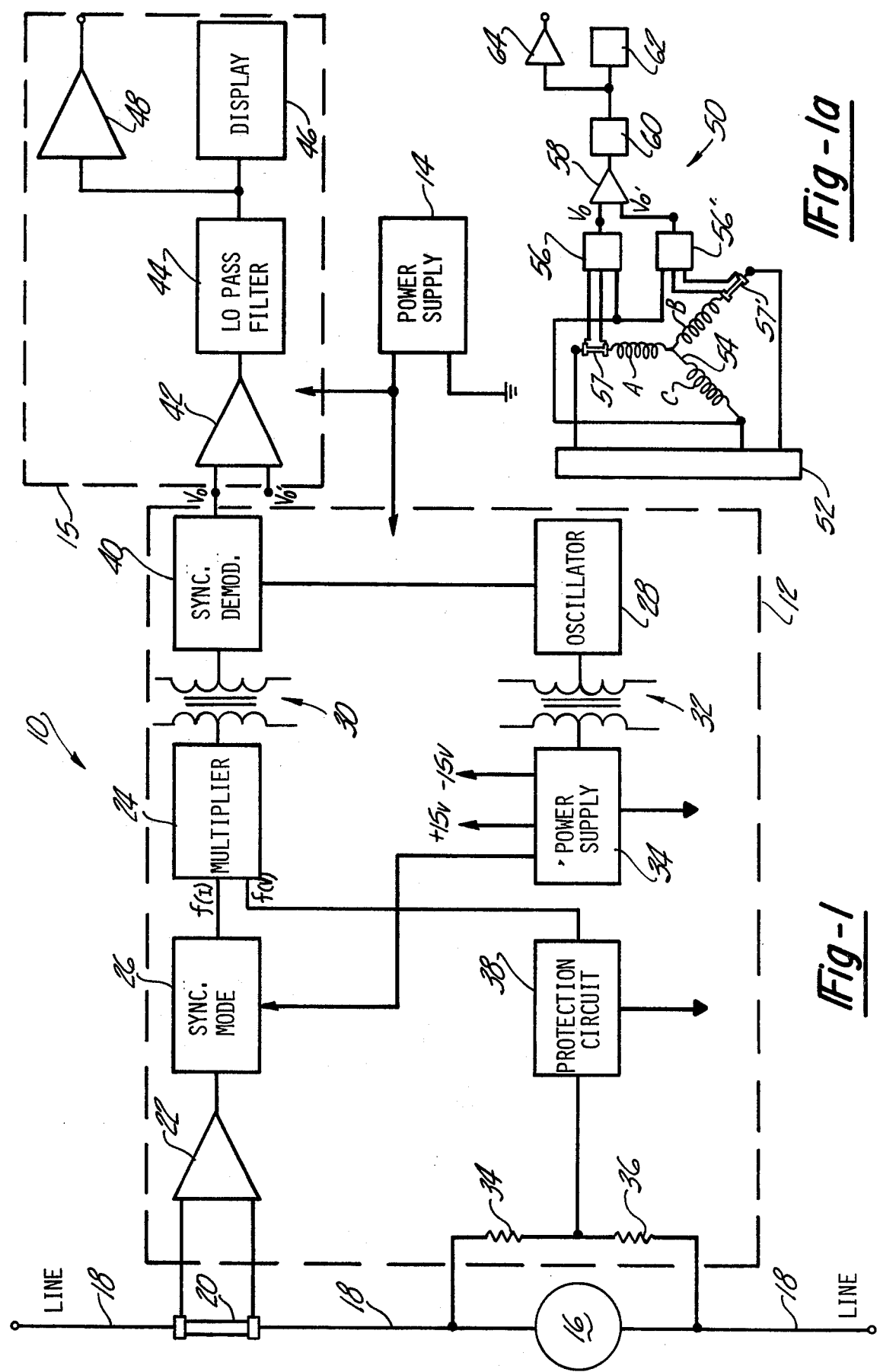
FIG. 1 is a block diagram of the preferred embodiment of the power monitor.
FIG. 1a is a block diagram of an alternative embodiment of the power monitor.

Referring to FIG. 1, a block diagram of the power monitor 10 is illustrated. The monitor 10 is composed of wattmeter module 12, power supply 14 and output digital display module 15. The monitor 10 is connected to calculate and display the power dissipated in an electrical load 16. Line voltage is supplied to the load 16 via conductors 18. For the present example, the load 16 is a single phase AC motor. However, it is contemplated that the power dissipated in any electrical load could be monitored by the present invention. A shunt 20 of the type manufactured by Ram Meter, Inc., type MSA-XXX, is electrically inserted in series with load 16. The shunt 20 is a precision high amperage resistor through which current flows on its way to the motor 16 or other load. Although of slightly greater resistance than conventional shunts, the shunt 20 employs standard technology which would be known to one skilled in the art in light of a given set of design parameters. A voltage is developed across the shunt 20 that is proportional to the current flow through the load. A shunt amplifier 22 increases this voltage into a range useful to a subsequent multiplier stage 24. A synchronous modulator stage 26 is interposed between the shunt amplifier 22 and multiplier 24 which effectively reverses the polarity of the amplified signal from the output of shunt amplifier 22 at a rate determined by oscillator stage 28. A modulation frequency of approximately 22 KHz is used to achieve maximum operational efficiencies and to eliminate inherent error signals in multiplier units which are typically available in the market. This synchronous modulation is also necessary for the operation of the signal isolation transformer 30 in DC load applications. It should be noted that the synchronous modulation process is not necessary for the monitor to operate with an AC load. However, it is included in the monitor 10 to permit universal AC and DC application of the monitor 10, to optimize efficiency during AC operation and to allow use of relatively small, compact isolation transformers. The synchronous modulator is driven by oscillator 28 through power isolation transformer 32 and a "hot side" power supply 34. The applicant intends that "modulation" and "demodulation" as used herein be broadly construed to include all known synchronous and asynchronous as well as detector techniques. The use of synchronous modulation and demodulation in the preferred embodiment is merely a matter of engineering convenience. Additionally, it is contemplated that the modulation could be achieved through media other than electrical such as optical or mechanical. The isolation transformers 32 and 30 are necessitated to achieve a relatively safe output signal from the wattmeter module 12. By "relatively safe", the applicant means a voltage level which is nearly the potential of an earth ground.

The voltage drop across load 16 is determined by a voltage divider network made up of series resistors 34 and 36 connected together in parallel with the load 16. The tap of the voltage divider is electrically interconnected with the multiplier 24 through a protection circuit 38 which limits the voltage applied to the multiplier to a predetermined value, even in the event of improper hookup or a high voltage disturbance in the voltage across the motor 16. The voltage divider derives a voltage signal within the multiplier's input limits which is proportional to the voltage across the motor or load 16 being monitored.

The multiplier 24 performs an electronic multiplication operation on its two input signals which are a function of the current flowing through load 16 $f(I)$ and the voltage drop $f(V)$ across it. In this specification, electronic multiplication is defined as a multiplication function which is performed exclusively by semiconductor devices as distinguished from prior art electromechanical techniques. The output of multiplier 24 is thus a signal proportional to the product of the two inputs or the power being consumed by the load 16. Because of the extremely high currents and voltages involved in heavy electrical equipment, the output of multiplier 24 would typically be unsafe to interface directly with readout equipment. Accordingly, isolation transformer 30 is interposed to block the high voltage levels associated with the load, while magnetically coupling the signal to the low voltage side of the wattmeter module circuit.

The secondary winding of the isolation transformer 30 is connected electrically to a synchronous demodulator 40 which, like the synchronous modulator 26, is controlled by oscillator 28. After demodulation, the signal ($V_o$) is fed to output means 15, which produces a digital output display and optional analog output.

The synchronizing signal necessary for modulation and demodulation, along with power to run the isolated circuitry, is coupled across the power isolation transformer 32. In the output section or digital display module 15 is a summing amplifier 42 that provides the capability of using two wattmeter modules 12 if necessary in the system. In the present example, because only a single phase load 16 is being monitored by the horsepower monitor 10, the second input of summing amplifier 42 is not used. Summing amplifier 42 also converts watts to horsepower, which is merely an electrical scaling function based on the contrast relationship between horsepower and wattage (1 HP = 746 Watts). Also, by proper scaling, this monitor can display in units of kilowatts or percent of full scale. The display module 15 also comprises a low pass filter 44 to stabilize the displayed value when the power monitor is used in a circuit that has inherent and steady 60 Hz fluctuations. Filter 44 eliminates flicker in the display and allows the horsepower system to respond quickly to changes in horsepower. A digital display 46 is merely a volt meter that provides a reading in horsepower. An analog output signal is also provided for convenience and interfacing via amplifier 48.

Referring to FIG. 1a, an alternative application of the monitor 50 is illustrated. A power source 52 feeds a three phase inductive load 54. Two wattmeter modules 56 and 56' and shunts 57 and 57' are electrically interconnected to two of the three branches of the load 54, as hereinabove described, to measure the current flowing through the impedance in that particular leg A and B respectively of load 54. The voltage input to both modules 56 and 56' is fed from the third leg C of load 54. The outputs of the two modules $V_o$ and $V_o'$ are electrically connected to the inputs of summing amplifier 58. The output of summing amplifier 58 is fed through filter 60 to display 62 and amplifier 64, as described hereinabove as numbers 42, 44, 46 and 48, respectively. With this arrangement, the output signal of summing amplifier 58 becomes a function of the total power dissipated in load 54.

Figure 2:
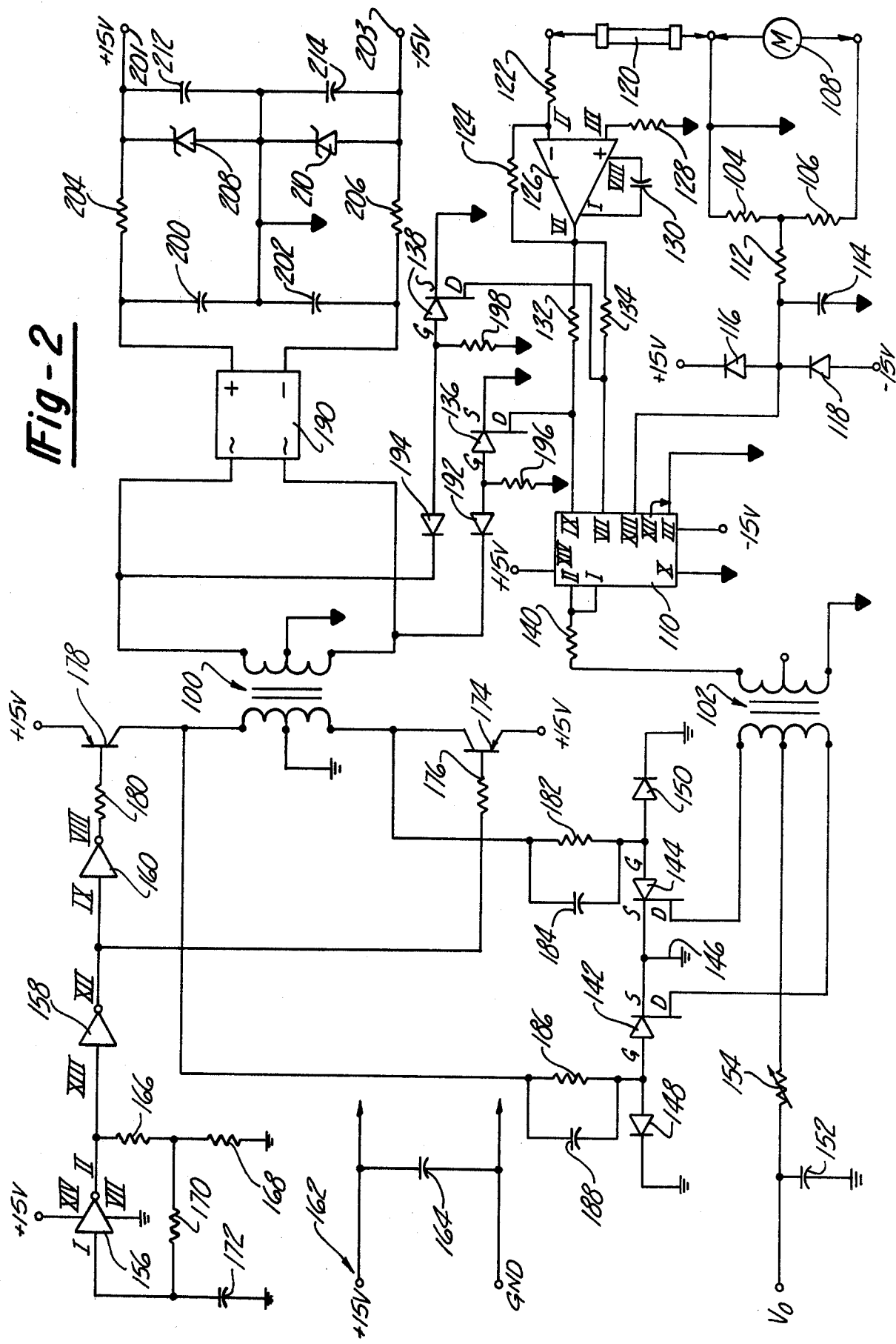
FIG. 2 is a schematic diagram of the wattmeter module.

Referring to FIG. 2, the schematic diagram of a wattmeter module is illustrated. Note that the ground symbols to the left of an imaginary line drawn through isolation transformers 100 and 102 are of conventional earth or chassis type. The ground points indicated to the right of isolation transformers 100 and 102 are not true grounds, but are representative of a local of "floating" ground which varies in absolute potential inasmuch as it rides on a relatively high load line voltage. Two series resistors 104 and 106 are connected in parallel with the load 108. Resistors 104 and 106 constitute a voltage divider and their values are selected, depending upon the application, so that the tap remains within a range of ±10 volts. The tap of the voltage divider is electrically interconnected with terminal XIII of multiplier 110 through a 100K resistor 112. Terminal XIII is also interconnected to floating ground through a 68pf capacitor 114. The capacitor 114 and resistor 112 comprise a low pass filter which eliminates high frequency spikes and spurious fluctuations from the input wave form. Resistor 112 also serves as a current limiter, should an input overvoltage occur.

Terminal XIII of multiplier 110 is also electrically interconnected to a positive 15 volt and negative 15 volt DC power supply through reverse biased diodes 116 and 118, respectively. Diodes 116 and 118 serve as overvoltage protection which provide a low impedance path for current flow should either diode become forward biased. During normal operation, the voltage applied to terminal XIII of multiplier 110 is within the range of ±10 volts. Terminal XII of multiplier 110 is connected directly to floating ground, as is terminal X. Terminal III of multiplier 110 is electrically connected to the −15 volt power supply and terminal XIV is electrically connected to the +15 volt power supply. Diodes 116 and 118 are of the type sold by General Electric, Model 1N914A. Multiplier 110 is of the type sold by Analog Devices, Model AD532. It is contemplated, however, that equivalent circuits well known in the art can be substituted. In this specification, terminals referenced by Roman Numberals correspond to the actual terminal designations on the cited devices. The operational characteristics of multiplier 110 conform to the following relationship; reference being made to the multiplier terminal numbers:

$$E_{II}(OUT) = (E_{VII} - E_{IX})(E_{XIII} - E_{XII})/10$$

Figure 3:
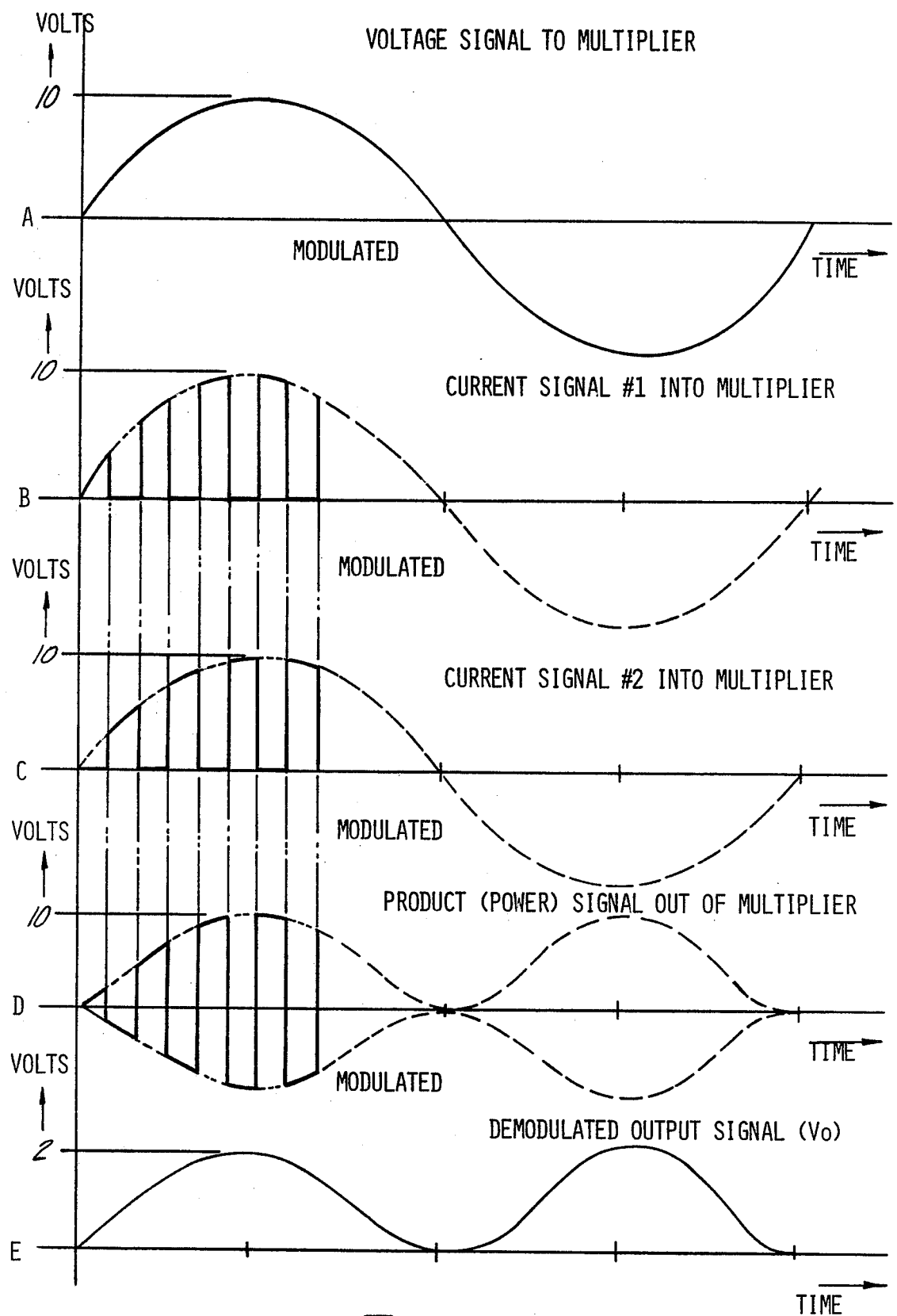
FIG. 3a is a voltage signal waveform to the multiplier.
FIG. 3b is a modulated current signal waveform to the multiplier.
FIG. 3c is the other modulated current signal waveform to the multiplier.
FIG. 3d is the modulated product or power signal from the multiplier.
FIG. 3e is the demodulated wattmeter module output signal $V_o$.

A high current shunt 120 is inserted in-line with the load 108 being monitored. The point of common connection of shunt 120 and load 108 is electrically connected to floating ground. The voltage drop across the shunt, which is proportional to the current flowing through the load, is fed into an operational amplifier (OP AMP). The OP AMP gain is determined by the ratio series input resistor 122 and feedback resistor 124. Both these resistors feed the negative input of the amplifier 126 which is of the type manufactured by National Semi-Conductor, Model LM308A. The positive input, terminal III of amplifier 126, in connected to floating ground through a 1K resistor 128 which provides a voltage reference point therefor. Terminals I and VIII of amplifier 126 are bridged by a 330 pf capacitor 130 which provides frequency compensation for the OP AMP. The input terminal VI of amplifier 126 is electrically interconnected to terminals IX and VII of multiplier 110 through a 5.6K series resistors 132 and 134, respectively. Resistors 132 and 134 serve as current limitors. Assuming, for example, the load 108 being monitored is a single phase AC 60 Hz motor, the input signal to terminal XIII of amplifier 110 will be a 60 Hz sine wave, as indicated in FIG. 3, Graph A. The amplitude is controlled by the voltage divider resistors 104 and 106 and will be approximately ±10 volts peak. Terminal XII of multiplier 110 is connected to floating ground and, therefore, will have zero input.

A 22 KHz oscillator, which will be described in detail below, generates a square wave which alternately biases Field Effect Transistors (FET) 136 and 138 into a conductive and non-conductive state. The source terminal of both FETs 136 and 138 are electrically connected to floating ground. The drains are electrically connected to terminals IX and VII of multiplier 110, respectively. When FET 136 is conductive, terminal IX is effectively connected to the floating ground and when FET 138 is conductive, terminal VII is electrically connected to floating ground. When FETs 136 and 138 are alternately not conductive, the respective input signals to terminals IX and VII will be as indicated in wave forms B and C in FIG. 3, respectively. Effectively, the square wave output from the 22 KHz oscillator modulates the 60 Hz output of amplifier 126. Referring to the characteristic equation of multiplier 110, its output voltage from terminal II will be the product of the input at terminal XIII (wave form A) and alternatingly the input at terminal IX (wave form B) and terminal VII (wave form C) of multiplier 110. Although multiplier 110 sees a positive input in terminal VII, it is interpreted internally as a negative value.

The output or product signal from multiplier 110 is represented in wave form D in FIG. 3. Wave form D is shown at 10 volts peak, representing full scale conditions. The product signal is fed to one end of the primary coil of signal isolation transformer 102 through a 56 ohm current limiting resistor 140. The other end of the primary coil of isolation transformer 102 is electrically connected to floating ground. Terminal I of multiplier 110 is electrically interconnected with terminal II.

Although specially constructed to have extremely large primary to secondary coil breakdown voltages, the isolation transformers 100 and 102 employ standard technology which would be known to one skilled in the art in light of a given set of design parameters. The primary to secondary coil ratio of isolation transformer 102 is approximately ten: one. Each end of the secondary coil of transformer 102 is electrically connected to the drain of a pair of field effect transistors (FET) 142 and 144. FETs 142 and 144 are identical to FETs 136 and 138 and are of the type manufactured by Motorola, Model 2N5638. The source terminals of FETs 142 and 144 are electrically connected to earth ground 146. The gates of FETs 142 and 144 are also separately electrically interconnected to earth ground through diodes 148 and 150, respectively. Diodes 148 and 150 are of the type manufactured by General Electric, Model 1N914A. The center tap of the secondary coil of isolation transformer 102 is intended for connection to external output means through a low pass filter consisting of a 0.2 mf capacitor 152 which goes to ground and a series variable 5K resistor 154. The filter is intended to eliminate high frequency spurious signals caused by any mismatch within the system. Resistor 154 is also for gain calibration.

An oscillator is made up of three inverting sections 156, 158 and 160 electrically connected in series. These three sections are physically parts of a single digital hex invertor of the type manufactured by Motorola, Model No. MC14584. The invertor, along with its associated passive components, comprise a Schmitt Trigger. The oscillator obtains power from a +15 volt power supply 162 which is shunted to ground through a 10 mf filter capacitor 164. Note that power supply 162 is +15 volts with respect to ground and feeds only the circuit to the left of the isolation transformers 100 and 102, as opposed to the ±15 volt floating power supply feeding the circuit to the right of the isolation transformers. The +15 volt power supply 162 is electrically connected to pin XIV of invertor 156 and internally to invertors 158 and 160. Pin VII of invertor 156 is connected internally to invertors 158 and 160 and to earth ground. The output terminal II of invertor 156 is electrically connected to the input terminal XIII of invertor 158. The output terminal II of invertor 156 is also connected to earth ground through two series resistors 166 and 168 which form a voltage divider. Resistor 166 is 2.7K and resistor 168 is 11K. The tap of the voltage divider formed by resistors 166 and 168 is electrically connected to the input terminal I of invertor 156 through a 120K resistor 170. Input terminal I of invertor 156 is also electrically connected to earth ground through a 0.001 mf capacitor 172. Resistor 170 and capacitor 172 form an RC timing network which determines the frequency of the oscillator which in the preferred embodiment is approximately 22KHz. The operational theory of the Schmitt Trigger will not be elaborated upon, in as it is well known to those skilled in the art.

The second invertor stage 158 of the digital hex invertor is provided to "square up" the distorted wave output of invertor 156. The output terminal XII of invertor 158 is electrically connected to the input terminal IX of invertor 160. The output terminal XII of invertor 158 is also electrically connected to the base of a transistor 174 through a series 2.7K resistor 176. The output terminal VIII of invertor 160 is, likewise, fed electrically to the base of another transistor 178 through a series 2.7K resistor 180. Both transistors 174 and 178 are of the type manufactured by Motorola, Model 2N4402. The emitters of transistors 174 and 178 are both electrically connected to the +15 volt power supply. The collectors of transistors 174 and 178 are separately electrically connected, each to one end of the primary winding of the power isolation transformer 100. The center tap of the primary winding is electrically connected to earth ground. Transformer 100 has approximately a 1:1 primary to secondary coil turns ratio. The output signal from invertor 158 is substantially a square wave which is fed to the base of transistor 174. That signal is also inverted in invertor 160 and fed to the base of transistor 178. These transistors alternatively become relatively conductive and non-conductive when their base input signals are high and low, respectively.

The collector of transistor 174 is electrically connected to the gate of FET 144 through a parallel combination of a 100K resistor 182 and 33 pf capacitor 184. The collector of transistor 178 is, likewise, connected to the gate of FET 142 through a parallel combination of a 100K resistor 186 and 33 pf capacitor 188. Because FETs 142 and 144 are susceptible to damage in the forward bias condition, diodes 148 and 150 are connected electrically to ground from the gates of FETs 142 and 144, respectively, to serve as a relatively low impedance current drain in the forward bias condition. In normal operation, the voltage signal on the secondary winding of the signal isolation transformer 102 will be a scaled facsimile of wave form D in FIG. 3. As transistors 174 and 178 alternately become conductive, FETs 142 and 144, likewise, alternately are conductive when forward biased and extremely non-conductive when reverse biased, due to fly-back from the power isolation transformer. The center tap of the secondary coil of signal isolation transformer 102 will thus, always be positive with respect to that end of the coil which is electrically connected to the FET (142 or 144) that is conducting at any given time. The output signal $V_o$ therefore will be as illustrated in wave form E of FIG. 3.

The secondary coil of power isolation transformer 100 feeds the gates of FETs 136 and 138. Accordingly, the gates of FETs 142 and 144, as well as those of FETs 136 and 138, are alternately pulsed synchronously. Resistors 182 and 186 serve to limit current in the forward bias mode and capacitors 184 and 188 are "speed-up capacitors" which provide crisper, sharper, switching action. The ends of the secondary coil of power isolation transformer 100 electrically feed the AC inputs of bridge rectifier 190 which is of the type manufactured by Motorola, Model 920A3. The bridge rectifier and the circuitry directly to its right comprises a conventional full wave rectifier type power supply which, in this case, rectifies a square wave. The operation of the power supply will be described in detail below. The ends of the secondary winding of isolation transformer 100 are also electrically interconnected with the gates of FETs 136 and 138 through series diodes 192 and 194, respectively. The gates of FETs 136 and 138 are also interconnected with floating ground through 10K reference resistors 196 and 198. These resistors provide a reference voltage for the gate, as well as stabilize the switching action.

As stated above, as transistors 174 and 178 are alternately conductive and non-conductive, FETs 136 and 138, likewise, will be conductive and non-conductive. When FET 136 is non-conductive, 138 is; thus, there will be an input signal into terminal IX of multiplier 110, but not the input terminal VII. Alternately, when FET 138 is non-conductive, FET 136 will be; thus, terminal IX of multiplier 110 will be grounded and an input signal will be impressed on terminal VII of multiplier 110.

The high voltage side of the wattmeter module (to the right of the isolation transformer) is powered by a full wave rectifier power supply. The center tap of the secondary coil of the isolation transformer 100 is connected to floating ground. The output (plus and minus) terminals of bridge rectifier 190 are substantially plus and minus 15 VDC. These terminals are bridged by two series 0.22 mf filter capacitors 200 and 202. The center connection of the series combination of capacitors 200 and 202 is connected to floating ground. The outputs of bridge rectifier 190 are also connected to the power supply output terminals 201 and 203 through 1K current limiting resistors 204 and 206, respectively. The zener diodes 208 and 210 are electrically interconnected in a reversed bias configuration from the plus 201 and minus 203 outputs of the power supply to floating ground. Resistors 204 and 206 also serve to limit current in the zener diodes. The zener diodes 208 and 210 are of the type manufactured by Motorola, Model 1N4744. Filter capacitors 212 and 214 are also connected from the plus 201 and minus 203 output terminals of the power supply to floating ground. The outputs 201 and 203 of the power supply, therefore, will be substantially a steady state DC plus and minus 15 volts, respectively.

Note that the wave forms in FIG. 3 all reflect a full scale reading. $V_o$ will, therefore, always fluctuate between limits of 0 and plus 2 volts. Wave forms B, C, and D of FIG. 3 are greatly exaggerated on the time scale to illustrate the 22KHz modulation of the 60 Hz current signal into the multiplier.

Figure 4:
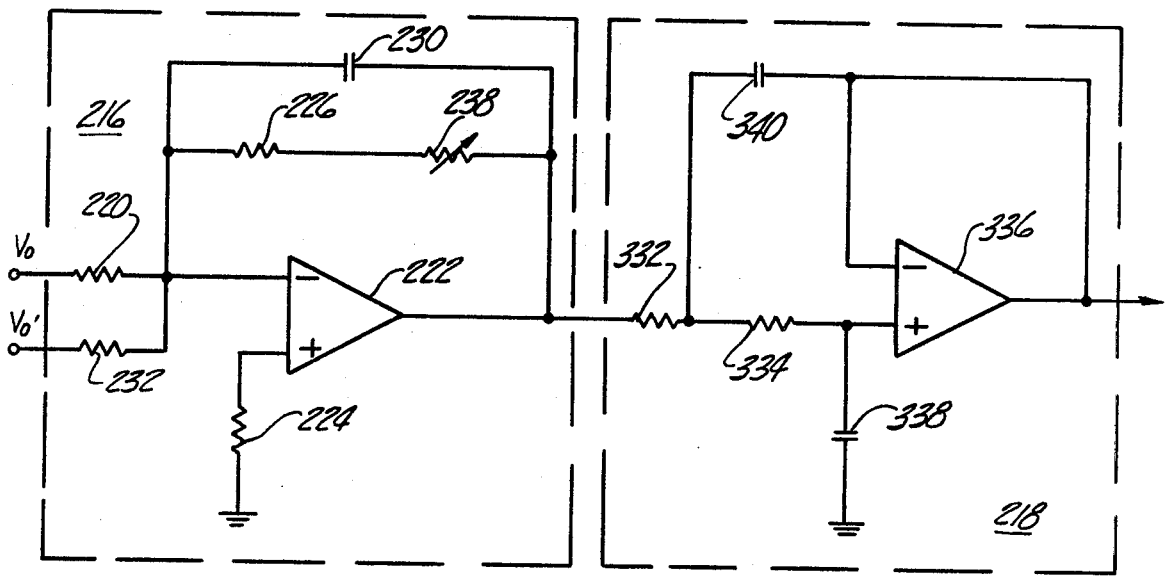
FIG. 4 is a schematic diagram of the summing amplifier and low pass filter in the output section of the power monitor.

Referring to FIG. 4, the output circuitry is illustrated. The circuitry is composed of a single pole filter, summing amplifier 216 and a low pass two pole filter 218. Continuing the single phase AC load illustration from FIG. 1, the incoming signal $V_o$ is electrically connected to the negative input of the OP AMP 222 through a 10K resistor 220. The OP AMP 222 positive input is electrically connected to earth ground through a 4.7K reference resistor 224. The output of OP AMP 222 is fed electrically to low pass filter 218. The OP AMP feedback circuit comprises a series combination of a 10K resistor 226 and a 50K variable resistor 228. The combination is electrically connected in parallel with a 0.47 mf filter capacitor 230. The feedback combination is electrically interconnected from the OP AMP output to its negative input. A second 10K resistor 232 is also electrically connected to the negative input of OP AMP 222. This input (labeled $V_o'$) is only used for three phase applications. In such a case, the additive combined wave forms $V_o$ and $V_o'$ are fed into the filtering, summing amplifier 216. The OP AMP also serves to amplify the input signal so as to convert it to units of horsepower, kilowatts or percent full load of scale. The filtering, summing amplifier 216 takes the output from the wattmeter module $V_o$ and averages it. The output of OP AMP 222 will be substantially a DC value with a slight AC ripple superimposed upon it. Because of the slight ripple on the output from the OP AMP 222, the output signal from filtering summing amplifier 216 is fed into a low pass two pole filter 218 to eliminate the ripple and keep the display constant. Filter 218 is of standard construction, well known in the art. Its input comprises two series 33K resistors 332 and 334 which feed the positive input of an operational amplifier 336. OP AMPs 336 and 222 are of the type manufactured by National Semi-Conductor, type 741. The positive input of the OP AMP 336 is also connected to earth ground through a 0.33 mf capacitor 338. The feedback network is a direct electrical interconnection of the OP AMP output and its negative input. Additionally, the positive and negative inputs of the OP AMP are bridged by a series combination of a 0.47 mf capacitor 340 and resistor 334. The output of the filter 218 is then electrically fed to a metered or digital display means, such as a voltmeter and optionally through an amplifier to provide an analog output.

Figure 5:
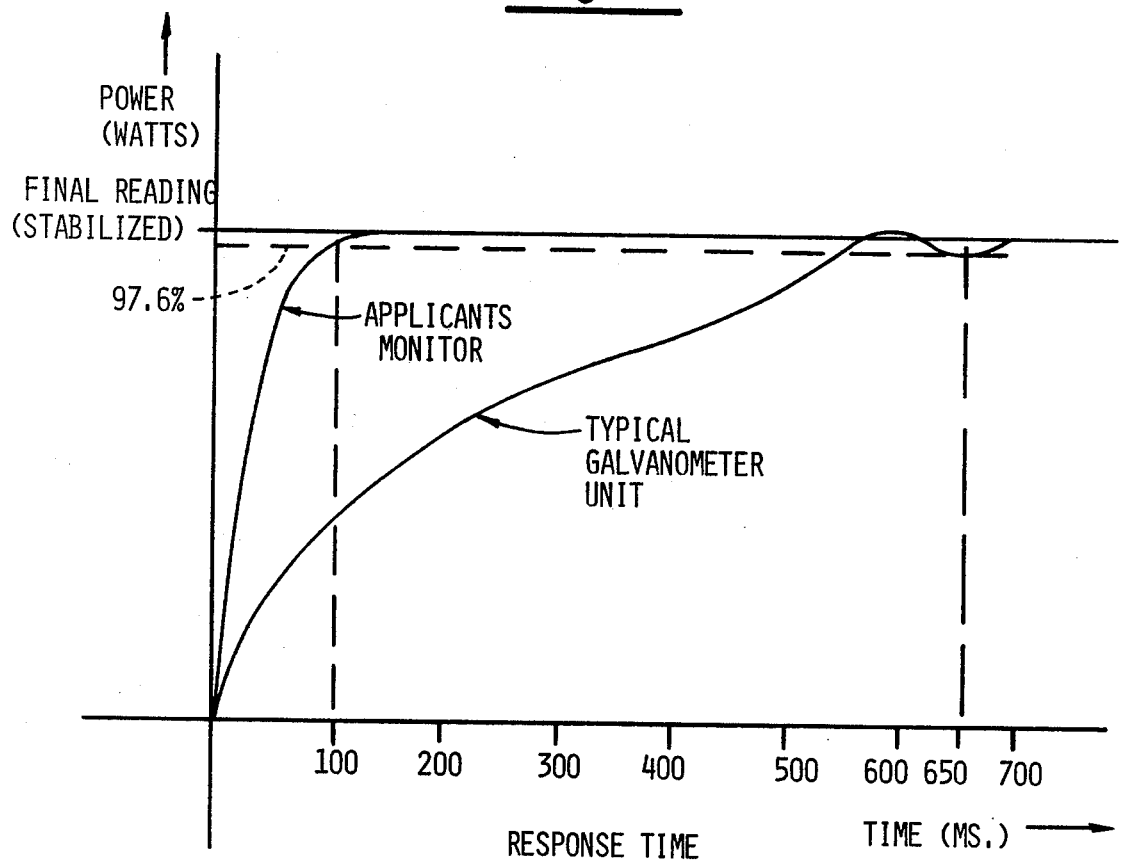
FIG. 5 is a response time graph comparing the preferred embodiments of the invention to a typical prior art unit.

Referring to FIG. 5, the device response time is graphically illustrated. The present device rises to 97.6% of the final reading value in approximately 100 milliseconds, while typical galvanometric units require 650 milliseconds or longer. Note that because of the mechanical nature of a galvanometer unit, there will be a characteristic overshoot in return, due to inertia of the mechanism, before stabilization is reached.

The output circuitry, as well as the digital display, can be employed at a location remote from the load being monitored and the wattmeter module(s). The wattmeter module is located on or in the near proximity of the shunt. This arrangement eliminates the need to divert any significant amount of line current or voltage from the load feed lines. The operator of the unit will only be exposed to an extremely low voltage ($V_o$ and $V_o'$). Accordingly, the present invention is extremely versatile and relatively safe to use, as compared to prior art devices.

Another advantage to the present invention would be found in a situation where a number of electrical loads are found in a single facility or complex and it is deemed desirable to periodically monitor the power dissipation in each load. In such a case, appropriate shunts and wattmeter modules could be incorporated into each such load and the outputs routed to a single location which would then be alternately or selectively monitored on a single output digital display module.

It is to be understood that the invention has been described with reference to specific embodiments which provide the features and advantages previously described, and that such specific embodiments are susceptible of modification, as will be apparent to those skilled in the art. Accordingly, the foregoing description is not to be construed in a limiting sense.

The embodiments of the invention in which an exclusive property or privilege is claimed are defined as follows:

1. A power monitor of the type which calculates the instantaneous power drawn by an electrical load as the product of the voltage drop across the load and the electrical current flowing through the load, said monitor comprising:
   input means operative to detect the voltage drop across and current through an electrical load and to generate separate corresponding electrical signals in proportion thereto;
   multiplier means operative to read the signals associated with the load current and voltage and to electronically generate a product signal proportional to the product thereof;
   isolation means operative to read said product signal and to generate an electrical output signal which is proportional thereto and electrically isolated therefrom;
   and output means operative to read the isolation means output signal and to generate a sensible display thereof.

2. Apparatus as defined in claim 1 further comprising a modulation circuit electrically interposed mediate said input means and multiplier means, and operative to modulate the signal associated with the load current.

3. Apparatus as defined in claim 2 further comprising a demodulation circuit electrically interposed mediate said isolation means and output means, and operative to demodulate said isolation output signal.

4. Apparatus as defined in claim 3 further comprising oscillator means electrically connected to said demodulator and electrically interconnected to said modulator by said isolation means, said oscillator means driving said modulator and demodulator.

5. Apparatus as defined in claim 1 wherein said input means comprises a shunt, electrically connected in series with said load and operative to detect the electrical current flowing through said load.

6. Apparatus as defined in claim 1 wherein said isolation means comprises a signal isolation transformer and a power isolation transformer.

7. Apparatus as defined in claim 1 wherein said sensible display is physically remote from said input means, multiplier means and isolation means.

8. In a power monitor of the type which calculates the instantaneous power drawn by an electrical load as the product of the voltage drop across the load and electrical current flowing through the load, and having sensible output means electrically connected thereto, at least one wattmeter module comprising:
  input means operative to detect the voltage drop across and current through an electrical load and to generate separate corresponding electrical signals in proportion thereto;
  multiplier means operative to read the signals associated with the load current and voltage and to electronically generate a product signal proportional to the product thereof;
  and isolation means operative to read said product signal and to generate an electrical output signal which is proportional thereto and electrically isolated therefrom.

9. Apparatus as defined in claim 8 further comprising a modulation circuit electrically interposed mediate said input means and multiplier means, and operative to modulate the signal associated with the load current.

10. Apparatus as defined in claim 9 further comprising a demodulation circuit electrically interposed mediate said isolation means and output means, and operative to demodulate said isolation output signal.

11. Apparatus as defined in claim 10 further comprising oscillator means electrically connected to said demodulator and electrically interconnected to said modulator by said insolation means, said oscillator means driving said modulator and demodulator.

12. Apparatus as defined in claim 8 wherein said input means comprises a shunt, electrically connected in series with said load and operative to detect the electrical current flowing through said load.

13. Apparatus as defined in claim 8 wherein said isolation means comprises a signal isolation transformer and a power isolation transformer.

14. A power monitor of the type which calculates the instantaneous power drawn by an electrical load as the product of the voltage drop across the load and the electrical current flowing through the load, said monitor comprising:
  a low impedance shunt electrically connected in series with said load;
  amplifier means operative to read a voltage drop across said shunt and generate an output signal in proportion thereto;
  a modulator operative to read said output signal, to modulate said signal and to generate a modulated output signal as a function thereof;
  voltage input means opeative to read the voltage drop across said load and generate a voltage reference signal in proportion thereto;
  multiplier means operative to read said modulated output signal and said voltage reference signal to electronically generate a product signal proportional to the product thereof;
  isolation means operative to read said product signal and to generate an electrical isolated output signal which is proportional thereto and electrically isolated therefrom;
  a demodulator operative to read said isolated output signal, to demodulate said isolated output signal and to generate a display signal as a function thereof;
  an oscillator operative to synchronously drive both said modulator and demodulator;
  and output means operative to read said display signal and to generate a sensible display thereof.

15. Apparatus as defined in claim 14 wherein said voltage input means comprises a voltage divider network.

16. Apparatus as defined in claim 14 wherein said isolation means comprises a signal isolation transformer and a power isolation transformer.

17. Apparatus as defined in claim 14 wherein said multiplier means comprises a single integrated circuit.

18. Apparatus as defined in claim 14 further comprising an input overvoltage protection circuit electrically interposed mediate said voltage input means and said multiplier.

19. A method of monitoring power by calculating the instantaneous power drawn by an electrical load as the product of the voltage drop across the load and the electrical current flowing through the load, said method comprising the steps of:
  reading the voltage drop across and current flowing through an electrical load and generating separate electrical signals in proportion thereto;
  multiplying said separate electrical signals and generating a product signal as a function of the product thereof;
  electrically isolating said product signal by passing it through magnetic coupling means;
  and generating a sensible display of said isolated product signal.

20. Method described in claim 19 further comprising the step of modulating the electrical signal proportional to said load current.

21. Method described in claim 20 further comprising the step of demodulating said isolated product signal.

* * * * *